United States Patent
Heck (10) Patent No.: US 7,236,763 B2
(45) Date of Patent: Jun. 26, 2007

(54) METHOD AND APPARATUS PROVIDING IMPROVED MIXER PERFORMANCE FOR RADIO RECEIVERS

(75) Inventor: Joseph P. Heck, Fort Lauderdale, FL (US)

(73) Assignee: Motorola, Inc., Schaumburg, IL (US)

( * ) Notice: Subject to any disclaimer, the term of this patent is extended or adjusted under 35 U.S.C. 154(b) by 453 days.

(21) Appl. No.: 10/860,837

(22) Filed: Jun. 4, 2004

(65) Prior Publication Data

US 2005/0272394 A1  Dec. 8, 2005

(51) Int. Cl.
*H04B 1/26* (2006.01)

(52) U.S. Cl. .................. 455/323; 455/326; 455/333; 327/113; 327/116

(58) Field of Classification Search ........ 455/313, 455/314, 323–333; 327/113, 116
See application file for complete search history.

(56) References Cited

U.S. PATENT DOCUMENTS

| | | | |
|---|---|---|---|
| 5,303,417 A * | 4/1994 | Laws .................. 455/314 |
| 6,125,272 A | 9/2000 | Bautista et al. |
| 6,144,846 A * | 11/2000 | Durec .................. 455/323 |
| 6,603,964 B1 * | 8/2003 | Rowley et al. .......... 455/333 |
| 7,113,755 B2 * | 9/2006 | Abdelli ................ 455/118 |
| 2003/0104799 A1 * | 6/2003 | Hayek et al. ........... 455/324 |
| 2003/0157918 A1 * | 8/2003 | Gamliel ............... 455/326 |
| 2003/0169089 A1 * | 9/2003 | Manku et al. .......... 327/359 |
| 2004/0121751 A1 * | 6/2004 | Shen .................. 455/313 |

\* cited by examiner

*Primary Examiner*—Edward F. Urban
*Assistant Examiner*—Blane J Jackson (57) ABSTRACT

A mixer circuit (50) includes a first switching mixer (20A) with a first desired signal input (RF+ and RF−), a first switching signal input (LO+& LO−), and a first output (IF+ and IF−), a second switching mixer (20B), and a third switching mixer (20C) with corresponding desired signal inputs, switching signal inputs, and outputs. An overall input signal to the mixer circuit is fed to an input port (56) of the first switching mixer, an output from an output port (57) of the first switching mixer is fed to an input port (58) of the second switching mixer, the output from an output port (59) of the second switching mixer is fed to an input port (60) of the third switching mixer, and an overall output of the mixer circuit can be an output from an output port (62) of the third switching mixer.

19 Claims, 5 Drawing Sheets

METHOD AND APPARATUS PROVIDING IMPROVED MIXER PERFORMANCE FOR RADIO RECEIVERS

STATEMENT REGARDING FEDERALLY SPONSORED RESEARCH OR DEVELOPMENT

The United States Government supported research related to the invention and has certain rights herein.

FIELD OF THE INVENTION

This invention relates generally to electrical circuits, and more particularly to mixer circuits.

BACKGROUND OF THE INVENTION

Mixers take two input signals and multiply them together to realize a frequency translation. Standard Gilbert Cell based mixers require some amount of DC (direct current) bias current for nominal operation. This bias current results in an undesired power dissipation and limits low-power performance. This problem is exacerbated when bipolar topologies are utilized and input bias currents are required which dissipate additional quiescent power. Moreover, the bias current cannot simply be scaled down in order to achieve low-power operation. Scaling the currents affects the required loading conditions, frequency response, and gain performance. In extremely low-power/low-current applications, the required passive loads prove unmanageably large and active loads at high frequencies are not currently practical in the art. Gilbert Cell mixers also have a limited output voltage swing based on biasing and load conditions.

The undesired input bias currents associated with bipolar topologies can be eliminated by utilizing CMOS topologies but the unwanted DC bias tail current still remains. Another alternative is to use CMOS switching mixer topologies which solve the DC bias issues but they have high levels of carrier feedthrough due to charge injection and some don't have the capability for rail-to-rail performance.

In receiver circuits, mixers translate a high input radio frequency (RF) to a lower intermediate frequency (IF). This process is known as down-conversion utilizing the difference term between the mixer's RF input and local oscillator input (LO) for low-side injection (LO frequency<RF frequency) or the difference term between the mixer's LO and RF for high-side injection. This downconversion process can be described by the following equation:

$$f_{IF} = \pm f_{RF} \pm f_{LO}$$

where $f_{IF}$ is the intermediate frequency at the mixer's output port, $f_{RF}$ is any RF signal applied to the mixer's RF input port, and $f_{LO}$ is the local oscillator signal applied to the mixer's LO input port.

Ideally, the mixer output signal amplitude and phase are linearly related to the input signal's amplitude and phase and independent of the LO signal amplitude. (Note this is in contrast to a multiplier where the output amplitude changes with LO amplitude.) Using this assumption, the amplitude response of the mixer is linear for the RF input and is independent of the LO input amplitude.

However, mixer nonlinearities produce undesired mixing products called spurious responses, which cause undesired signals reaching the mixer's RF input port to produce a response at the IF frequency. The signals reaching the RF input port do not necessarily have to fall into the desired RF band to be troublesome. Many of these signals are sufficiently high in power level that the RF filters preceding the mixer don't provide enough selectivity to keep them from causing interference. When they interfere with the desired IF frequency, the mixing mechanism can be described by:

$$f_{IF} = \pm m f_{RF} \pm n f_{LO}$$

Note that m and n are integer harmonics of both the RF and LO frequencies that mix to create numerous combinations of spurious products. In reality, the amplitude of these spurious components decreases as the value of m or n increases.

Knowing the desired RF frequency range, frequency planning is used to carefully select the IF and resulting LO frequency selections to avoid spurious mixing products whenever possible. Filters are used to reject out-of-band RF signals that might cause in-band IF responses. IF filter response following the mixer is specified to pass only the desired frequencies thereby filtering the spurious response signals ahead of the final detector. Spurious responses that appear within the IF band will not be attenuated by the IF filter.

Many types of balanced mixers reject certain spurious responses where m or n is even. Ideal double balanced mixers reject all responses where m or n (or both) is even. The IF, RF, and LO ports are mutually isolated in all double balanced mixers. Therefore, with properly designed baluns, these mixers can have overlapping RF, IF, and LO bands.

In fundamental terms, mixer design involves trade-offs among several performance objectives and specifications, including balanced operation, noise figure, second and third order intermodulation (IM) distortion, power drain, and cost. Although a mixer described in U.S. Pat. No. 6,603,964 achieves many of these performance objectives, no existing mixer design achieves an exceptional level of performance for each of the objectives simultaneously.

SUMMARY OF THE INVENTION

Embodiments in accordance with the present invention can provide a mixer having an improved level of performance in the areas of balanced operation, noise figure, second and third order intermodulation (IM) distortion, power drain, and cost.

In a first embodiment of the present invention, a mixer circuit can include a first switching mixer with a first desired signal input, a first switching (or reference) signal input, and a first output, a second switching mixer with a second desired signal input, a second switching (or reference) signal input, and a second output, and a third switching mixer with a third desired signal input, a third switching (or reference) signal input, and a third output. An overall input signal to the mixer circuit can be fed to an input port of the first switching mixer, an output of the first switching mixer can be fed to an input port of the second switching mixer, the output of the second switching mixer can be fed to an input port of the third switching mixer, and an overall output of the mixer circuit can be an output of the third switching mixer.

In a second embodiment of the present invention, a mixer circuit can include a first quad ring differential switching mixer with differential radio frequency inputs, differential local oscillator (LO) inputs, and differential intermediate frequency outputs, a second quad ring differential switching mixer with differential radio frequency inputs, differential local oscillator inputs, and differential intermediate frequency outputs, and a third quad ring differential switching mixer with differential radio frequency inputs, differential local oscillator inputs, and differential intermediate frequency outputs. Note that an overall input signal to the mixer circuit can be fed to an input port of the first quad ring differential switching mixer, an output of the first quad ring differential switching mixer can be fed to an input port of the second quad ring differential switching mixer, the output of the second quad ring differential switching mixer can be fed to an input port of the third quad ring differential switching mixer, and an overall output of the mixer circuit can be an output of the third quad ring differential switching mixer. The first quad ring differential switching mixer can function as an input chopper with the local oscillator signal operating at a chopping frequency, the second quad ring differential switching mixer can function as a mixing device with the local oscillator signal operating at the mixer circuit local oscillator frequency, and the third quad ring differential switching mixer can function as an output chopper with the local oscillator signal operating at a chopping frequency.

The first, second, and third quad ring differential switching mixers can be made from a plurality of transmission gates using a high speed Complimentary Metal Oxide Semiconductor (CMOS) Integrated Circuit process such as complementary NMOS FETs and PMOS FETs. The NMOS FETs and PMOS FETs can be formed in parallel to create bilateral switches capable of highly linear ON resistance and very large OFF resistance over a wide voltage swing. The ON and OFF states of the switches are controlled with the Differential Local Oscillator (LO) signal of the mixer such that the Differential Output signal of the mixer is equivalent to the Differential RF Input signal of the mixer with its polarity reversing at the rate of the LO signal. The mixer circuit can further include local oscillator buffer drivers at the input of each of the local oscillator ports for each of the first, second, and third quad ring differential switching mixers. Such a mixer is particularly suited for wireless communication receivers such as CMOS direct conversion receivers.

In a third embodiment of the present invention, a method of improving RF mixer performance can include the steps of forming bilateral switches having highly linear ON resistance and very large OFF resistance over a wide voltage swing, configuring the bilateral switches in a quad ring configuration with a differential input, a differential output, and a differential local oscillator input, and controlling the ON and OFF states of the bilateral switches with a differential local oscillator signal. The differential output signal of the RF mixer can substantially equal the differential RF input signal of the RF mixer with its polarity reversing and the rate of polarity reversal of the differential output signal can be equal to the rate of the local oscillator signal. The method can further include the step of coupling three instances of the quad ring configuration together to form the RF mixer. The first instance of the quad ring configuration can provide an input chopper function with its local oscillator signal operating at a chopping frequency while the second instance of the quad ring configuration can provide a mixing function with its local oscillator operating at the mixer local oscillator frequency. The third instance of the quad ring configuration can provide an output chopper with its local oscillator at the chopping frequency.

Other embodiments, when configured in accordance with the inventive arrangements claimed herein can include various arrangements that can vary from the embodiments disclosed yet be well within the scope of the claimed invention as recited in the claims below.

DETAILED DESCRIPTION OF THE DRAWINGS

While the specification concludes with claims defining the features of embodiments of the invention that are regarded as novel, it is believed that embodiments in accordance with the invention will be better understood from a consideration of the following description in conjunction with the figures, in which like reference numerals are carried forward.

Figure 1:
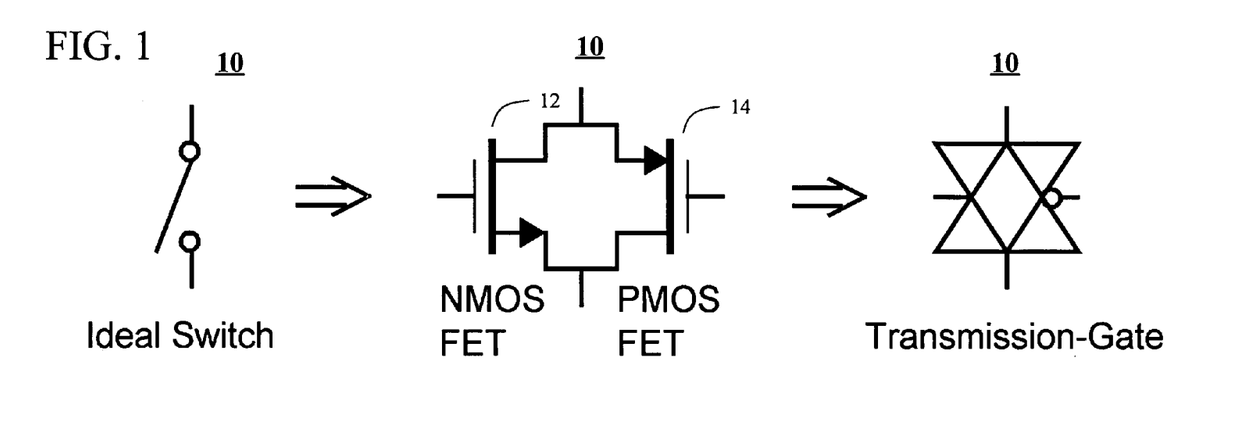
FIG. 1 is a circuit diagram as well as symbolic and block representations of a transmission gate switch in accordance with an embodiment of the present invention.
Figure 2:
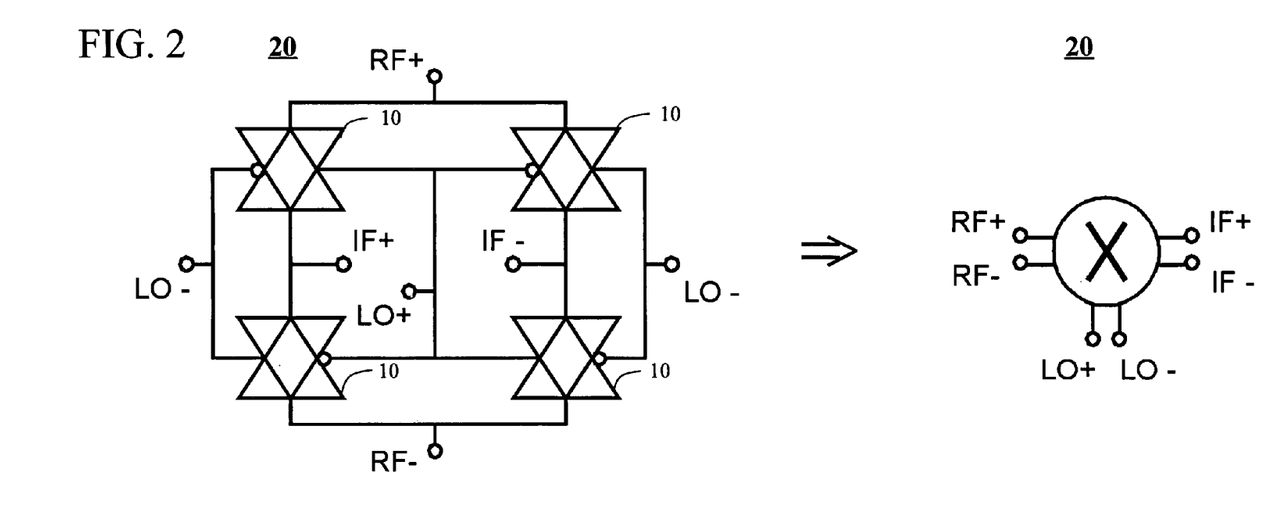
FIG. 2 is a block diagram and an alternative representation of a quad ring balanced differential switching mixer comprising of transmission gate switches in accordance with an embodiment of the present invention.
Figure 3:
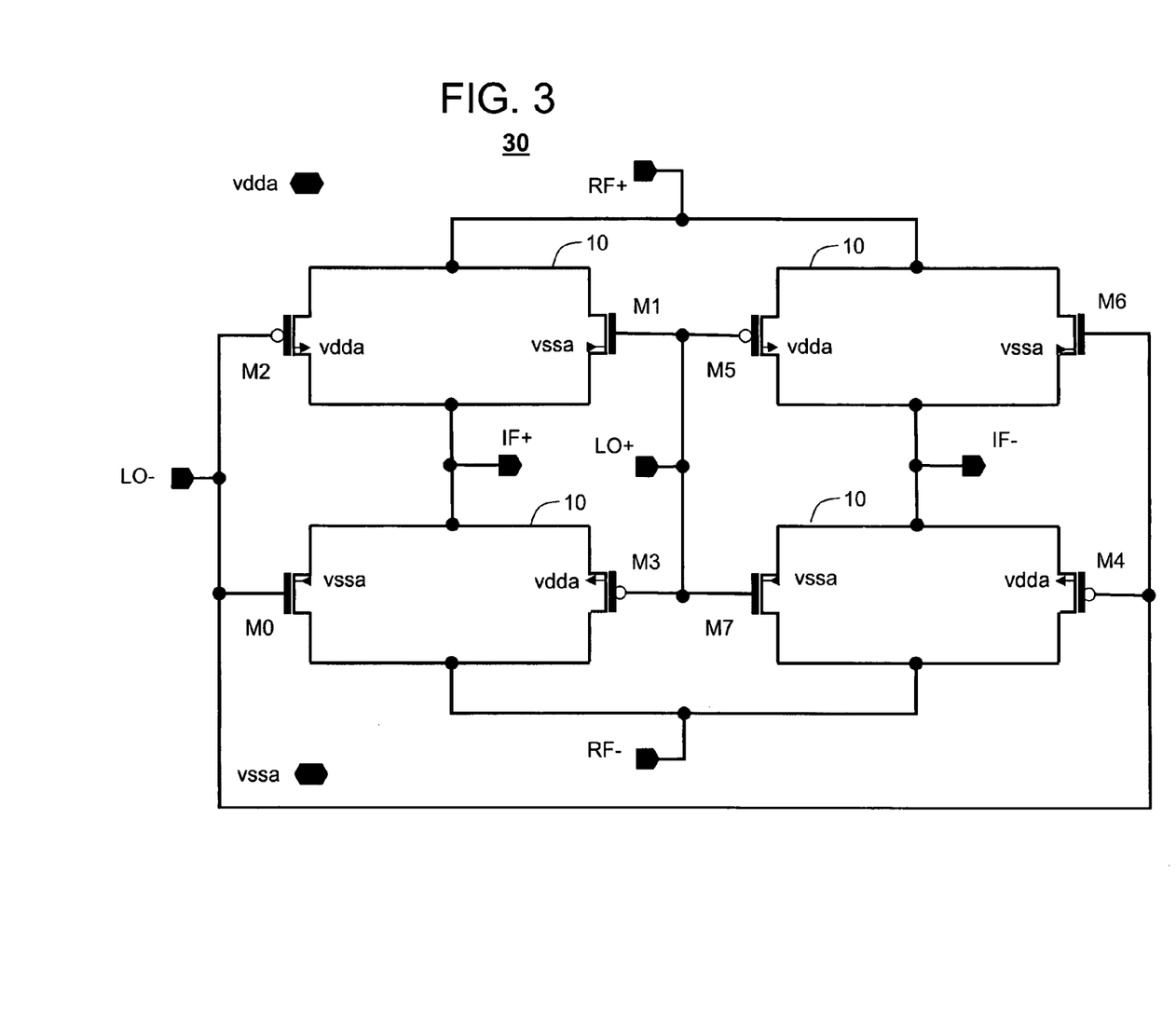
FIG. 3 is a schematic diagram of a switching mixer similar to the switching mixer of FIG. 2 implemented in a 90 micron "CMOS90" integrated circuit (IC) in accordance with an embodiment of the present invention.

Referring to FIGS. 1 and 2, representations of circuits illustrate the use of a complementary NMOS FET 12 and a PMOS FET 14 to form a Transmission-Gate (T-Gate) switch 10, which in turn is used (using multiple instances) to form a quad ring balanced switching mixer 20 as shown in FIG. 2 with differential RF and LO inputs and a differential IF output. Referring to FIG. 3, a schematic diagram of a switching mixer 30 similar or substantially equivalent to the switching mixer 20 of FIG. 2 as implemented using a 0.09 micron or 90 nm "CMOS90" IC process. The switching mixer 20 can be a mixer that controls the ON/OFF states of the switches with the differential LO signal of the mixer 20 such that the differential output signal of the mixer 20 is equivalent to the Differential RF Input signal of the mixer with its polarity reversing at the rate of the LO signal.

Figure 4:
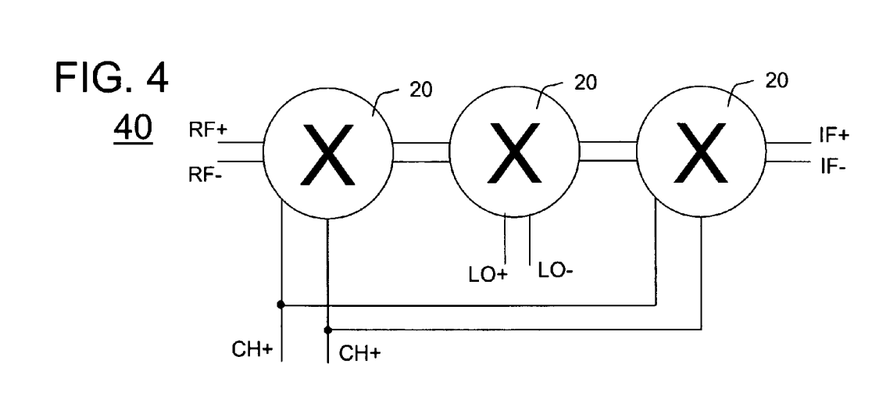
FIG. 4 is a representation of a mixer comprised of three switching mixers in accordance with an embodiment of the present invention.
Figure 5:
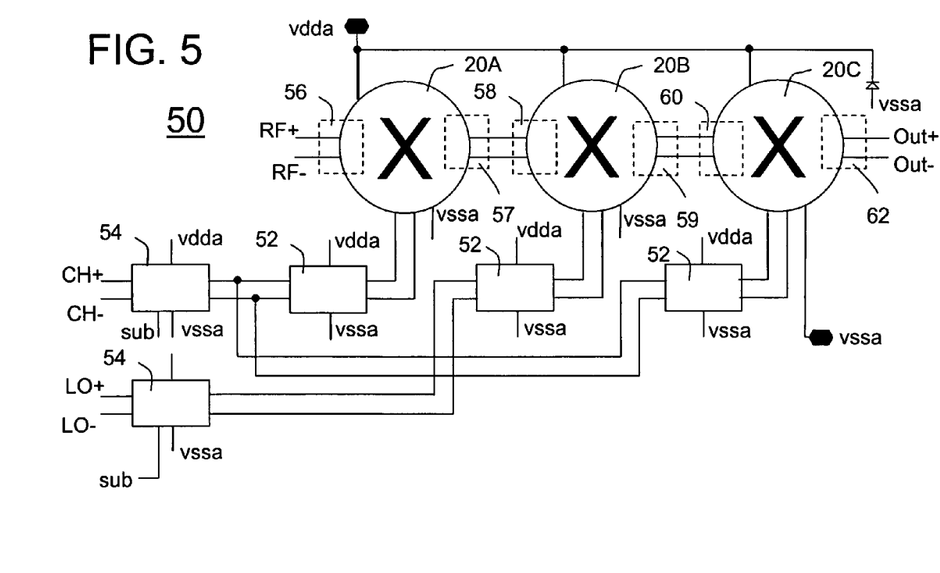
FIG. 5 is a schematic diagram of an entire mixer similar to FIG. 4 further including local oscillator buffer drivers and implemented in the 90 micron "CMOS90" IC process in accordance with an embodiment of the present invention.

Referring to FIG. 4, an implementation of a chopping mixer 40 is illustrated by combining three copies of the switching mixer 20. In a more detailed embodiment of a CMOS90 implementation of an entire chopping mixer 50 as illustrated in FIG. 5, the chopping mixer 50 includes three copies of the switching mixer (20A, 20B, and 20C) as well as LO buffers 52 and level shifters 54 coupled to the respective switching mixers 20. The mixer circuit 50 can include a first switching mixer (20A) with a first desired signal input (RF+ and RF−), a first switching signal input (LO+& LO−), and a first output (IF+ and IF−), a second switching mixer (20B), and a third switching mixer (20C) with corresponding desired signal inputs, switching signal inputs, and outputs. An overall input signal to the mixer circuit can be fed to an input port 56 of the first switching mixer, an output from an output port 57 of the first switching mixer can be fed to an input port 58 of the second switching mixer, the output from an output port 59 of the second switching mixer can be fed to an input port 60 of the third switching mixer, and an overall output of the mixer circuit can be an output from an output port 62 of the third switching mixer.

Figure 6:
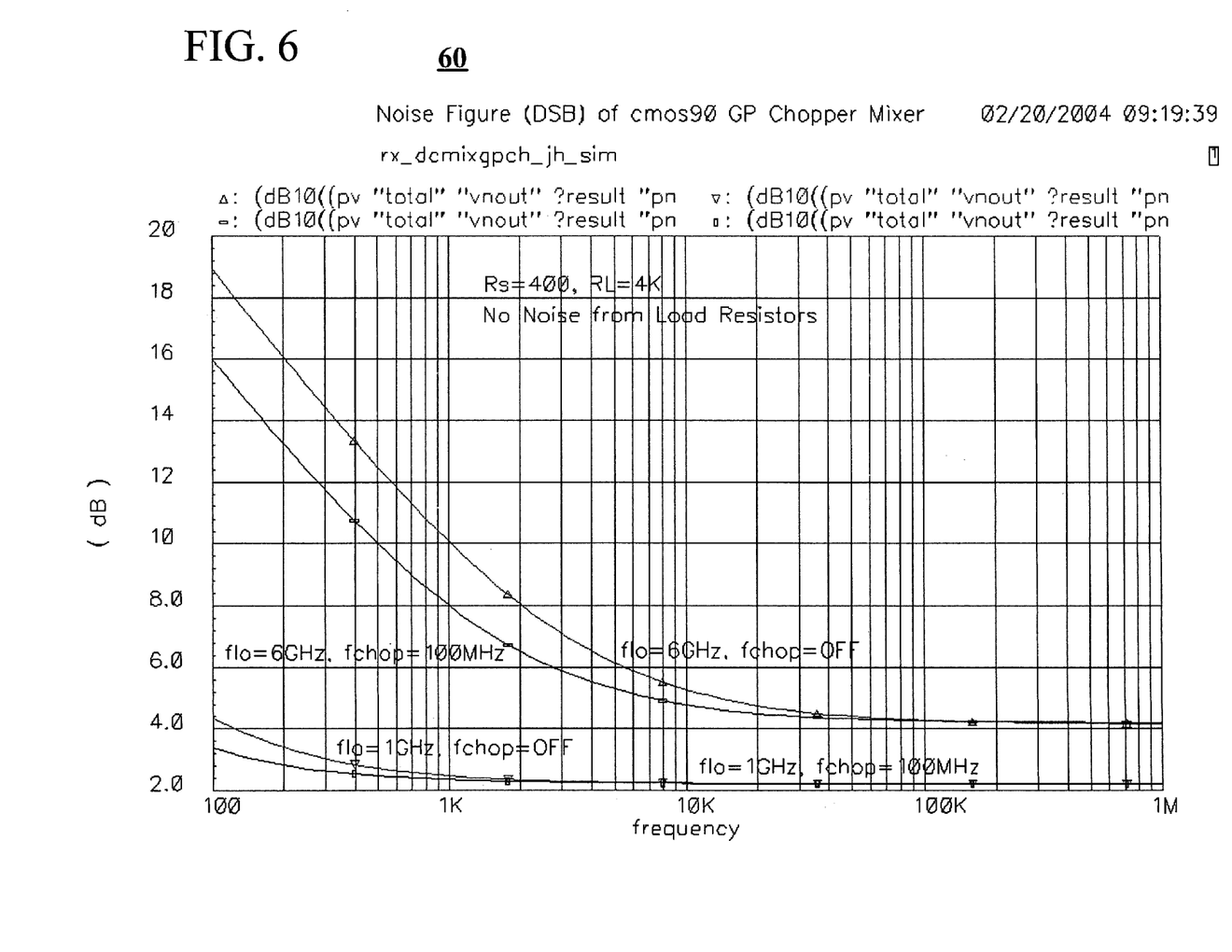
FIG. 6 is a chart illustrating the simulated noise figure versus Intermediate Frequency (IF) output frequency for local oscillator frequencies of 1 GHz and 6 GHz for implementation using the high speed "GP" process option in accordance with an embodiment of the present invention.

Many of the improvements in performance of the mixer embodiments herein can be illustrated and demonstrated with regard to a simulated Noise Figure versus IF output frequency chart 60 of FIG. 6 which illustrates simulations for LO frequencies of 1 GHz and 6 GHz for implementation using the high speed "GP" process option. Note that "GP" stands for "General Purpose" which is high speed compared to an "LP" or "Low Power" option. GP simply means the FET gate oxide thickness is 16 Angstroms as opposed to 21 Angstroms for the LP process. These are the fastest devices currently available on the CMOS90 process and have a minimum gate length of 90 nm or 0.09 microns and maximum supply voltage of 1.2 V. Other devices used, referred to below are the 2.5V devices, which have a gate oxide thickness of 50 Angstroms and minimum gate length of 0.28 microns. Further note that the embodiments in accordance with the present invention are not limited to the devices and processes disclosed, but can use other processes and devices within the scope and spirit of the claims.

Dynamic Matching (Chopping) similar to the "dynamic matching" concept described in U.S. Pat. No. 6,125,272, IIP2 (second-order input intercept point), flicker noise and DC Offset are among the improved mixer features and improved performance data resulting from embodiments in accordance with the invention. In addition, such mixer can have excellent power drain, linearity, and Noise Figure (NF).

The input intercept point represents a hypothetical input amplitude at which the desired signal components and undesired components are equal in amplitude. For the case where the mixer LO power is held constant, the order of the intercept point or distortion product is determined only by the RF multiplier and not by the LO multiplier because variations in the RF signal are only of concern. The order refers to how fast the amplitudes of the distortion products increase with a rise in input level. For example, the 2nd-order intermodulation (IM) products will increase in amplitude by 2 dB when the input signal is raised by 1 dB. Also, third-order input intercept point (IIP3) is the point at which the power in the third-order product and the fundamental tone intersect. IIP3 is a very useful parameter to predict low-level intermodulation effects.

For example, simulation results using 0.28 u 2.5 V (50 Angstrom gate oxide thickness) CMOS90 devices can provide the following performance data:
NF=4.8 dB (=loss),
BW~2.5 GHz
Current Drain 1.41 mA typical (×2 for I+Q) from 2.5V @ 1 GHz with Chopping at 100 MHz
IIP3>+10 dBm 2.5 V ("High Voltage" 280 nm Gate Length) FETs can be used for improved dynamic range and interface to baseband filters where the maximum operating frequency would be limited to around 2.5 GHz.

"GP" High-Speed/Low-Voltage devices were simulated with outstanding results for maximum frequency (6 GHz) and current drain with the following data:
Current Drain Reduces to ~0.35 mA @ GHz from 1.2V Supply (×2 for I+Q Mixers)
Lower Voltage Swing Capability Does Not Appear to Affect IM Performance. (Swing Is Limited by LNA Output.)

Referring once again to FIG. 5, the current drain of the mixer 50 comes only from the LO buffer stages. The good performance of this mixer can be attributed in large part to the use of complementary p-channel (PMOS) and n-channel (NMOS) devices forming each of the plurality of switching mixers 20 in the mixer 50. Even under very large signal swing conditions, the complementary switches maintain low on resistance and the mixer maintains very linear operation. The input and output common mode voltage is placed at half the supply voltage. When the signal swings far toward the positive rail, the PMOS devices turn on hard and maintain a low on resistance. Conversely, when the signal swings far toward the negative rail (ground), the NMOS devices turn on hard. In the mid-region, both the NMOS and PMOS devices are on. The signal can actually swing linearly a few tenths of a volt above and below the positive and negative rails before the well diodes begin to forward bias.

In summary, an embodiment of the present invention implemented using a high speed Complimentary Metal Oxide Semiconductor (CMOS) Integrated Circuit process such as complementary NMOS and PMOS devices in parallel to form bilateral switches capable of highly linear ON resistance and very large OFF resistance over a wide voltage swing can be arranged in a configuration providing improved performance in a switching mixer configuration such as a quad ring configuration. For example, the placement of four (4) such bilateral switches in the quad ring configuration with a differential input, a differential output, and a differential LO input can control the ON/OFF states of the switches with the differential LO signal of the mixer such that the differential output signal of the mixer is substantially equivalent to the differential RF input signal of the mixer with its polarity reversing at the rate of the LO signal. Three instances of the quad ring configuration of the switching mixer enables the first instance (of the quad ring configuration) to function as an input chopper with its LO signal at the chopping frequency, the second instance to function as a mixing device with its LO signal at the mixer LO frequency, and the third instance to function as an output chopper with its LO signal at the chopping frequency. The overall input signal is fed to the input port of the first mixer, the output of the first mixer is fed to the input of the second mixer, and the output of the second mixer is fed to the input of the third mixer. The overall output of the mixer is the output of the third mixer.

Figure 7:
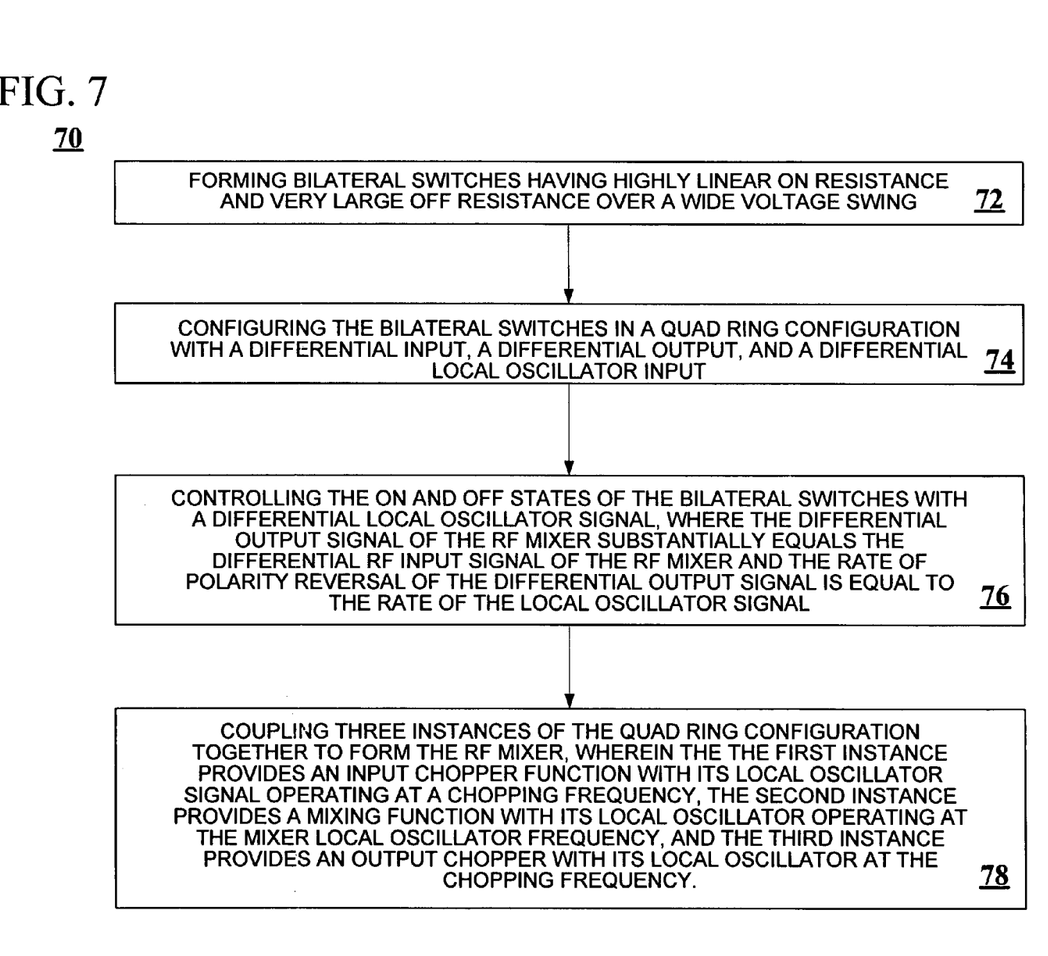
FIG. 7 is a flow chart illustrating a method of improving RF mixer performance in accordance with an embodiment of the present invention.

Referring to FIG. 7, a method 70 of improving RF mixer performance can include the step 72 of forming bilateral switches having highly linear ON resistance and very large OFF resistance over a wide voltage swing, configuring at step 74 the bilateral switches in a quad ring configuration with a differential input, a differential output, and a differential local oscillator input, and controlling at step 76 the ON and OFF states of the bilateral switches with a differential local oscillator signal. The differential output signal of the RF mixer can substantially equal the differential RF input signal of the RF mixer and the rate of polarity reversal of the differential output signal can be equal to the rate of the local oscillator signal. The method 70 can further include the step 78 of coupling three instances of the quad ring configuration together to form the RF mixer. The first instance of the quad ring configuration can provide an input chopper function with its local oscillator signal operating at a chopping frequency while the second instance of the quad ring configuration can provide a mixing function with its local oscillator operating at the mixer local oscillator frequency.

The third instance of the quad ring configuration can provide an output chopper with its local oscillator at the chopping frequency.

In light of the foregoing description, it should be recognized that embodiments in accordance with the present invention can be realized in hardware, software, or a combination of hardware and software. Any kind of computer system, or other apparatus adapted for carrying out the functions described herein, is suited. A typical combination of hardware and software could be a general purpose computer system with a computer program that, when being loaded and executed, controls the computer system such that it carries out the functions described herein.

In light of the foregoing description, it should also be recognized that embodiments in accordance with the present invention can be realized in numerous configurations contemplated to be within the scope and spirit of the claims. Additionally, the description above is intended by way of example only and is not intended to limit the present invention in any way, except as set forth in the following claims.

What is claimed is:

1. A mixer circuit, comprising:
   a first quad ring differential switching mixer with differential radio frequency inputs, differential local oscillator inputs, and differential intermediate frequency outputs;
   a second quad ring differential switching mixer with differential radio frequency inputs, differential local oscillator inputs, and differential intermediate frequency outputs;
   a third quad ring differential switching mixer with differential radio frequency inputs, differential local oscillator inputs, and differential intermediate frequency outputs;
   wherein an overall input signal to the mixer circuit is fed to an input port of the first quad ring differential switching mixer, an output of the first quad ring differential switching mixer is fed to an input port of the second quad ring differential switching mixer, the output of the second quad ring differential switching mixer is fed to an input port of the third quad ring differential switching mixer, and an overall output of the mixer circuit is an output of the third quad ring differential switching mixer.

2. The mixer circuit of claim 1, wherein the first, second, and third quad ring differential switching mixers are comprise of a plurality of transmission gates.

3. The mixer circuit of claim 2, wherein the plurality of transmission gates are comprised of complementary NMOS FETs and PMOS FETs.

4. The mixer circuit of claim 3, wherein the NMOS FETs and PMOS FETs are formed in parallel to form bilateral switches capable of highly linear ON resistance and very large OFF resistance over a wide voltage swing.

5. The mixer circuit of claim 2, wherein the transmission gates are made using a high speed Complimentary Metal Oxide Semiconductor (CMOS) Integrated Circuit process.

6. The mixer circuit of claim 1, wherein the mixer circuit further comprises local oscillator buffer drivers at the inputs of each of the local oscillator ports for each of the first, second, and third quad ring differential switching mixers.

7. The mixer circuit of claim 1, wherein the ON and OFF states of the switches are controlled with the Differential Local Oscillator signal of the mixer such that the Differential Output signal of the mixer is equivalent to the Differential RF Input signal of the mixer with its polarity reversing at the rate of the LO signal.

8. The mixer circuit of claim 1, wherein the first quad ring differential switching mixer functions as an input chopper with the local oscillator signal operating at a chopping frequency.

9. The mixer circuit of claim 1, wherein the second quad ring differential switching mixer functions as a mixing device with the local oscillator signal operating at the mixer circuit local oscillator frequency.

10. The mixer circuit of claim 1, wherein the third quad ring differential switching mixer functions as an output chopper with the local oscillator signal operating at a chopping frequency.

11. The mixer circuit of claim 1, wherein the mixer circuit is used in a wireless communication receiver.

12. The mixer circuit of claim 1, wherein the mixer circuit is used in a CMOS direct conversion receiver.

13. A mixer circuit, comprising:
    a first quad ring differential switching mixer with a first desired differential signal input, a first differential local oscillator switching signal input, and a first differential output, that operates at a chopping frequency of the first differential local oscillator;
    a second quad ring differential switching mixer with a second differential desired signal input, a second differential local oscillator switching signal input, and a second differential output that operates at a frequency of the second differential local oscillator switching signal input;
    a third quad ring differential switching mixer with a third differential desired signal input, a third differential local oscillator switching signal input, and a third output that operates at a chopping frequency of the third differential local oscillator;
    wherein an overall radio frequency input signal to the mixer circuit is fed to an input port of the first quad ring differential switching mixer, an output of the first quad ring differential switching mixer is fed to an input port of the second quad ring differential switching mixer, the output of the second quad ring differential switching mixer is fed to an input port of the third quad ring differential switching mixer, and an overall output of the mixer circuit is an output of the third quad ring differential switching mixer.

14. A wireless orwireline communication device, comprising:
    inputs for receiving a desired signal and a switching signal;
    a first quad ring differential switching mixer with a first differential desired signal input, a first differential local oscillator switching signal input, and a first differential output, wherein the first quad ring differential switching mixer functions as an input chopper;
    a second quad ring differential switching mixer with a second differential desired signal input, a second differential local oscillator switching signal input, and a second differential output, wherein the second quad ring differential switching mixer functions as a mixer;
    a third quad ring differential switching mixer with a third differential desired signal input, a third differential local oscillator switching signal input, and a third differential output, wherein the third quad ring differential switching mixer functions as an output chopper;
    wherein an overall input signal to the mixer circuit is fed to an input port of the first quad ring differential switching mixer, an output of the first quad ring differential switching mixer is fed to an input port of the second quad ring differential switching mixer, the output of the second quad ring differential switching mixer is fed to an input port of the third quad ring differential switching mixer, and an overall output of the mixer circuit is an output of the third quad ring differential switching mixer.

15. A wireless or wireline communication device, comprising:

inputs for receiving a desired signal and a reference signal; and a mixer circuit, comprising:

a first quad ring differential switching mixer with differential radio frequency inputs, differential local oscillator inputs, and differential intermediate frequency outputs;

a second quad ring differential switching mixer with differential radio frequency inputs, differential local oscillator inputs, and differential intermediate frequency outputs;

a third quad ring differential switching mixer with differential radio frequency inputs, differential local oscillator inputs, and differential intermediate frequency outputs;

wherein an overall input signal to the mixer circuit is fed to an input port of the first quad ring differential switching mixer, an output of the first quad ring differential switching mixer is fed to an input port of the second quad ring differential switching mixer, the output of the second quad ring differential switching mixer is fed to an input port of the third quad ring differential switching mixer, and an overall output of the mixer circuit is an output of the third quad ring differential switching mixer.

16. A method of improving RF mixer performance, comprising the steps of:

forming bilateral switches having highly linear ON resistance and very large OFF resistance over a wide voltage swing;

configuring the bilateral switches in a quad ring configuration with a differential input, a differential output, and a differential local oscillator input;

controlling the ON and OFF states of the bilateral switches with a differential local oscillator signal, wherein the differential output signal of the RF mixer substantially equals the differential RF input signal of the RF mixer and wherein the rate of polarity reversal of the differential output signal is equal to the rate of the local oscillator signal; coupling three instances of the quad ring configuration together to form the RF mixer.

17. The method of claim 16, wherein the first instance of the quad ring configuration provides an input chopper function with its local oscillator signal operating at a chopping frequency.

18. The method of claim 16, wherein the second instance of the quad ring configuration provides a mixing function with its local oscillator operating at the mixer local oscillator frequency.

19. The method of claim 16, wherein the third instance of the quad ring configuration provides an output chopper with its local oscillator at the chopping frequency.

* * * * *